(12) United States Patent
Nayler

(10) Patent No.: US 6,252,453 B1
(45) Date of Patent: Jun. 26, 2001

(54) DEVICE AND METHOD FOR SIGNAL RESAMPLING BETWEEN PHASE RELATED CLOCKS

(75) Inventor: Colin D. Nayler, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/488,255

(22) Filed: Jan. 20, 2000

(51) Int. Cl.[7] .............................. H03D 3/00; H04L 27/00; H04L 27/34
(52) U.S. Cl. .......................... 329/304; 329/313; 375/324; 375/329; 375/340
(58) Field of Search .................................... 329/304–310, 329/311–314; 375/324, 328, 329–333, 340

(56) References Cited

U.S. PATENT DOCUMENTS

| 5,504,785 | * | 4/1996 | Becker et al. | 375/344 |
| 5,612,975 | * | 3/1997 | Becker et al. | 375/319 |
| 5,764,113 | * | 6/1998 | Snell | 332/103 |
| 5,960,040 | * | 9/1999 | Cai et al. | 375/279 |
| 6,091,765 | * | 7/2000 | Pietzold, III et al. | 375/219 |
| 6,141,671 | * | 10/2000 | Adams et al. | 708/313 |

* cited by examiner

Primary Examiner—David Mis
(74) Attorney, Agent, or Firm—Renner, Otto, Boisselle & Sklar

(57) ABSTRACT

A method for demodulating a modulated carrier includes sampling the modulated carrier with an A/D converter clocking at a first sampling frequency to generate a modulated carrier series of samples occurring at the first sampling frequency. The first sampling frequency it selected to optimize a digital signal processor (DSP) design from demodulating a carrier modulated in accordance with a first transmission specification to recover base band data. The method includes generating a second series of samples occurring at a second sampling frequency representing the base band data. The second series of samples is calculated from the first series of samples and the second sampling frequency is selected to optimal a DSP design for recovering data from the base band data signal encoded in accordance with a second transmission specification.

10 Claims, 2 Drawing Sheets

DEVICE AND METHOD FOR SIGNAL RESAMPLING BETWEEN PHASE RELATED CLOCKS

TECHNICAL FIELD

The present invention relates generally to network interfacing, and more particularly, to a device and method for signal resampling between phase related clocks.

BACKGROUND OF THE INVENTION

The transmission of various types of digital data between computers continues to grow in importance. The predominant method of transmitting such digital data includes coding the digital data into a low frequency base data signal and modulating the base data signal onto a high frequency carrier signal. The high frequency carrier signal is then transmitted across a network cable medium, via RF signal, modulated illumination, or other network medium, to a remote computing station.

At the remote computing station, the high frequency carrier signal must be received and demodulated to recover the original base data signal. In the absence of any distortion of the carrier signal across the network medium, the received carrier would be identical in phase, amplitude, and frequency to the transmitted carrier and could be demodulated using known mixing techniques to recover the base data signal. The base data signal could then be recovered into digital data using known sampling algorithms.

However, the network topology tends to distort the high frequency carrier signal due to numerous branch connections and different lengths of such branches causing numerous reflections of the transmitted carrier. The high frequency carrier is further distorted by spurious noise caused by electrical devices operating in close proximity to the cable medium. Such problems are even more apparent in a network which uses home telephone wiring cables as the network cable medium because the numerous branches and connections are typically designed for transmission of plain old telephone system POTS signals in the 0.3–3.4 kilohertz frequency and are not designed for transmission of high frequency carrier signals on the order of 7 Megahertz. Further yet, the high frequency carrier signal is further distorted by turn-on transients due to on-hook and off-hook noise pulses of the POTS utilizing the network cables.

Such distortion of frequency, amplitude, and phase of the high frequency carrier signal degrades network performance and tends to impede the design of higher data rate networks and challenges designers to continually improve modulation techniques and data recovery techniques to improve data rates. For example, under the HPNA 1.0 standard, a 1 Mbit data rate is achieved using pulse position modulation (PPM) of a carrier, while the more recent 2.0 standard achieves a 10 Mbit data rate using a complex modulation scheme utilizing a frequency diverse quadrature amplitude modulation (QAM).

A problem associated with advancing standards and increasing data rates is that, as in the HPNA example, the modulation techniques are not the same. As such, backwards compatibility is not inherent in the design of the newer systems. For example, in the HPNA system, to be backwards compatible, the newer 2.0 receiver must be able to demodulate both the (PPM) modulated carrier compliant with the 1.0 standard and the frequency diverse QAM modulated carrier compliant with the 2.0 standard. As such, many of the functions in the receiver must be implemented in two distinct circuits, one circuit for the PPM and one circuit for the QAM, thereby increasing the cost and complexity of the receiver.

For example, receivers typically include an A/D converter for sampling the modulated carrier signal and generating a series occurring at a sample frequency. The series of samples are input to the remainder of the receiver circuitry that is typically implemented on a digital signal processor (DSP).

The complexity of the mathematics performed by the DSP is a function of various parameters including the sample frequency. The complexity of the mathematics also affects gate count and thus the size and cost of the DSP. As such, for a particular carrier modulation specification, the A/D sample frequency can be selected to minimize DSP gate count to reduce the DSP size and cost.

The problem exists in that the optimal sample frequency for one carrier modulation specification may not equal the optimal sample frequency for a second carrier modulation specification thereby requiring two A/D converters. Therefore, based on recognized industry goals for size and cost reductions, what is needed is a device and method for obtaining a series of samples representing a modulated carrier at two different sample frequencies but not requiring two A/D converts and/or two clocks.

SUMMARY OF THE INVENTION

A first object of the present invention is to provide a circuit comprising a demodulation circuit receiving a series of sample values representing a modulated carrier and generating a first series of sample values representing a base band data signal, the first series of sample data values occurring at a first sampling rate; and a resampler receiving the first series of sample values and generating a second series of sample values representing the base band data signal, the second series of sample data values occurring at a second sampling rate, the second sampling rate being a lower frequency than the first sampling rate.

The circuit may further comprise a second demodulation circuit receiving the series of sample values representing a modulated carrier and generating a series of second channel base band sample values representing a second channel base band data signal, the second channel base band sample values occurring at the first sampling rate.

The resampler may calculate each sample value in the second series of sample values from at least one value in the first series of sample values. The second series of sample values may include a plurality of in phase values and a plurality of out of phase values, each of the in phase values being equal to a simultaneously occurring value in the first series of sample values and each out of phase values being calculated from a sample value in the first series of sample values preceding the out of phase value and a sample value in the first series of samples values following the out of phase value.

The calculation may be a linear interpolation between the sample value in the first series of sample values preceding the out of phase value and the sample value in the first series of samples values following the out of phase value. The linear interpolation may be performed in a circuit utilizing a first multiplier multiplying the sample value in the first series of sample values following the out of phase value by a first coefficient and a second multiplier multiplying the sample value in the first series of sample values preceding the out of phase value by a second coefficient, the second coefficient being equal to one minus the first coefficient, and an adder adding a product of the first multiplier to a product of the second multiplier to generate the out of phase value. The modulated carrier may be at least one of a pulse position modulated carrier and a quadrature amplitude modulated carrier and first sampling rate may be 32 Mhz, the second sampling rate may be 30 Mhz, and a ratio of in phase values to out of phase values may be 1:15.

A second objective of the present invention is to provide a method of recovering data from a modulated carrier, comprising: a) sampling the modulated carrier with an A/D converter to generate a first series of modulated carrier sample values representing the modulated carrier, the modulated carrier sample data values occurring at a first sampling rate greater than four times a frequency of the modulated carrier; b) demodulating the series of modulated carrier sample values to generate a first series of sample data values representing a base band data signal, the sample values representing the base band data signal occurring at the first sampling frequency; and c) generating a second series of sample data values representing the base band data signal, the second series of sample data values occurring at a second sampling rate, the second sampling rate having a lower frequency than the first sampling rate. The method may further include demodulating the series of modulated carrier sample values to generate a third series of sample values representing a second channel base band data signal.

Each sample value in the second series of sample data values may be determined from at least one value in the first series of sample data values.

The second series of values may include a plurality of in phase values and a plurality of out of phase values, each in phase value being equal to a simultaneously occurring value in the first series of sample values and each out of phase value being calculated from a sample value in the first series of sample values preceding the out of phase value and a sample value in the first series of samples values following the out of phase value.

The calculation may be a linear interpolation between the sample value in the first series of sample values preceding the out of phase value and the sample value in the first series of samples values following the out of phase value. The linear interpolation may be performed in a circuit utilizing a first multiplier multiplying the sample value in the first series of sample values following the out of phase value by a first coefficient and a second multiplier multiplying the sample value in the first series of sample values preceding the out of phase value by a second coefficient, the second coefficient being equal to one minus the first coefficient, and an adder adding a product of the first multiplier to a product of the second multiplier to generate the out of phase value. The modulated carrier may be at least one of a pulse position modulated carrier and a quadrature amplitude modulated carrier and first sampling rate may be 32 Mhz, the second sampling rate may be 30 Mhz, and a ratio of in phase values to out of phase values may be 1:15.

DESCRIPTION OF THE PREFERRED EMBODIMENTS

Figure 1:
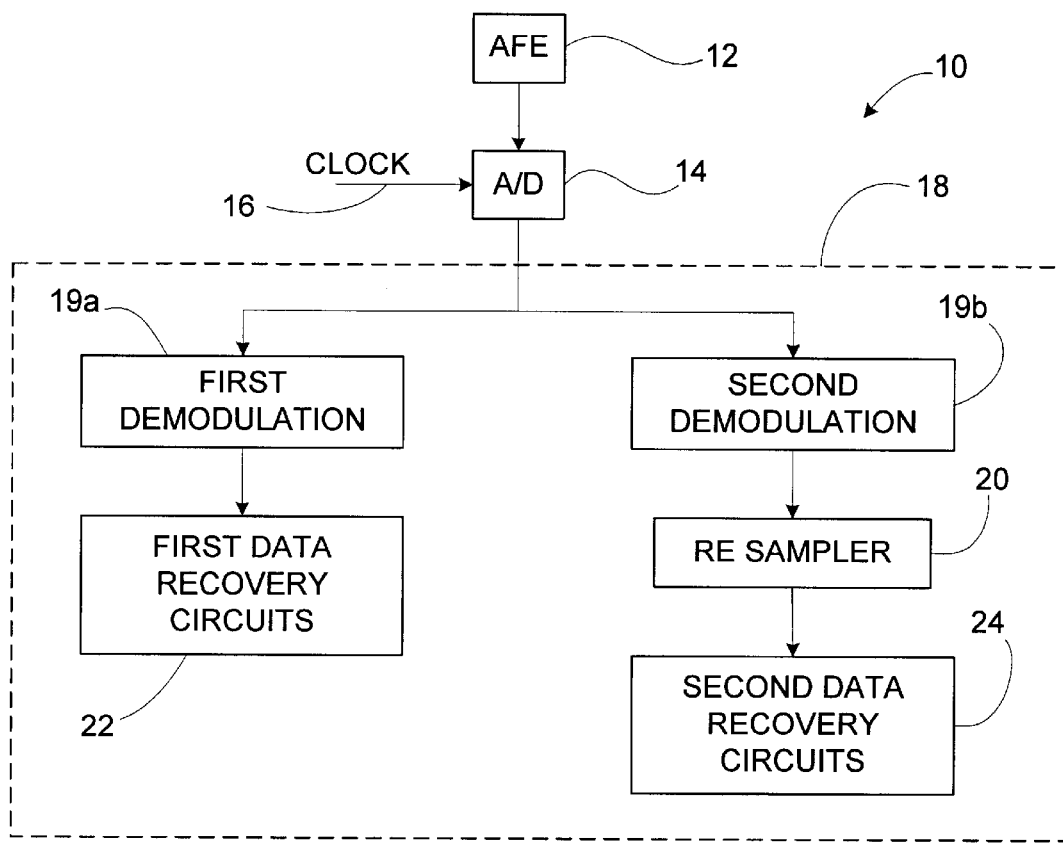
FIG. 1 is a block diagram representing a receiver in accordance with one embodiment of this invention.

The present invention will now be described in detail with reference to the drawings. In the drawings, like reference numerals are used to refer to like elements throughout.

Referring to FIG. 1, a block diagram of a receiver 10 which, in accordance with this invention, functions to receive data compatible with two distinct carrier modulation specifications is shown. The receiver 10 includes an analog front end 12 for detecting a modulated carrier signal on a transmission medium and appropriately amplifying the modulated carrier to be compatible with the input range of an A/D converter 14. The AND converter 14 is driven by a clock 16, operating at a prescribed clock frequency, to generate a first series of sample values occurring at a first sample frequency equal to the clock frequency. In the preferred embodiment the clock frequency and first sample frequency are 32 Mhz.

The first series of sample values from A/D converter 14 is input to a digital signal processor (DSP) 18 wherein the carrier is demodulated and the transmitted data is recovered. More specifically, the first series of sample values is input to a first demodulation circuit 19a, which in the preferred embodiment is a circuit for down mixing an HPNA 2.0 compliant QAM 7 Mhz carrier to sample values representing base band I and Q signals and slicing the I and Q signals to recover a first series of base band sample values using known QAM demodulation techniques. The base band sample values are then input to a first data recovery circuit 22 wherein the base band sample values are decoded to recover the transmitted data.

The first series of sample values is also input to a second demodulation circuit 19b which preferably down mixes an HPNA 1.0 compliant PPM modulated carrier to sample values representing base band I and Q signals and calculates a second series of base band sample values by calculating the square root of the sum of the squares of the I sample value and the Q sample value for each sample value:

$$\text{Base Band Sample Value} = (I^2 + Q^2)^{1/2}$$

The second series of base band sample values are input to a resampler 20. The resampler 20 functions to convert the series of sample values into a third series of sample values occurring at a second sample frequency, which, in the preferred embodiment is 30 Mhz.

The third series of data sample values may then be input to a second data recovery circuit 24, which in the preferred embodiment is a circuit for determining the timing position of a series of pulses representing data encoded in accordance with HPNA 1.0 pulse position modulation.

Figure 2:
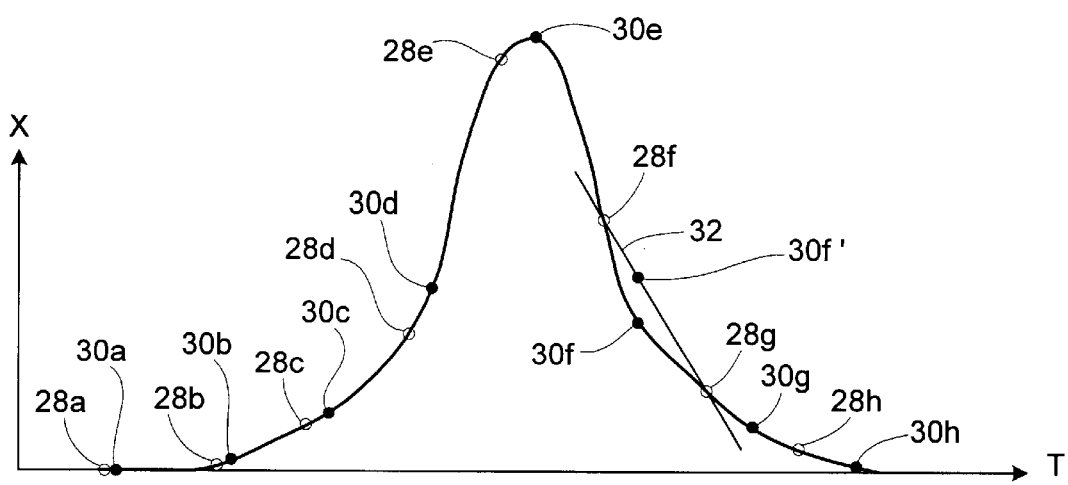
FIG. 2 is a time domain diagram of a base band signal sampled in accordance with one embodiment of this invention.

Referring to FIG. 2, a time domain diagram of the second base band data signal 26 is shown. As discussed previously, A/D converter 14 (FIG. 1) samples the modulated carrier 26 at a 32 Mhz sampling rate and demodulation circuits 19 generate the data sample values 28 (a)–(h). Resampler 20 operates to calculate the second series of data sample values 30 (a)–(h) which represent the base band data signal 26 at a 30 Mhz sample rate. Each value 30 in the second series of data sample values is calculated using an interpolation function between the immediately proceeding sample value 28 and the immediately following sample value 28 in the series of data sample values 28 (a)–(h). In the preferred embodiment, a linear interpolation is used, however, other interpolation techniques known to those skilled in the art can readily be used. For example, line 32 represents the linear interpolation between sample value 28 (f) and 28 (g) in the first series of sample values 28 (*a*)–(*h*) and line 32 is used to interpolate a value of sample value 30 (*f*)' approximating sample value 30 (*f*).

Figure 3:
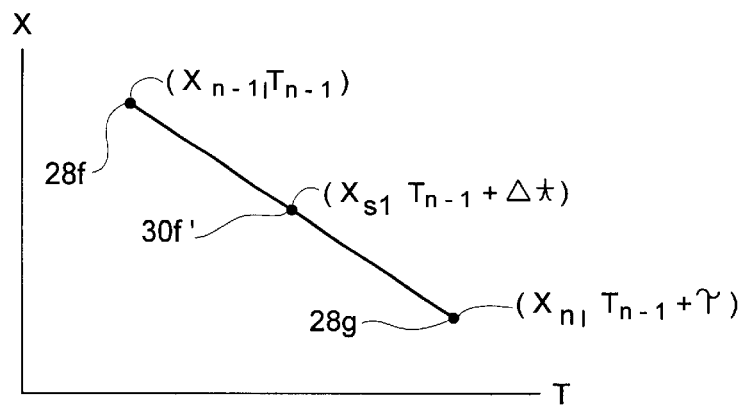
FIG. 3 is a diagram representing linear interpolation in accordance with one embodiment of this invention.

Referring to FIG. 3, a more detailed diagram showing the linear interpolation calculation of the value of sample value 30 (*f*) from each of sample values 28 (*f*) and 28 (*g*) is shown. More specifically, the value of sample value 30 (*f*), $X_s$, occurs at a determined time $T_{n-1}+\Delta t$ occurring between known time $T_{n-1}$ and known time $T_{n-1}+T$ based on a known relationship between the two clock frequencies 34 and 36. Known value $X_{n-1}$ occurs at known time $T_{n-1}$ and known value $X_n$ occurs at known time $T_{n-1}+T$. Therefore:

$$X_s = X_n(\Delta t/T) + X_{n-1}(1-\Delta t/T)$$

Figure 4:
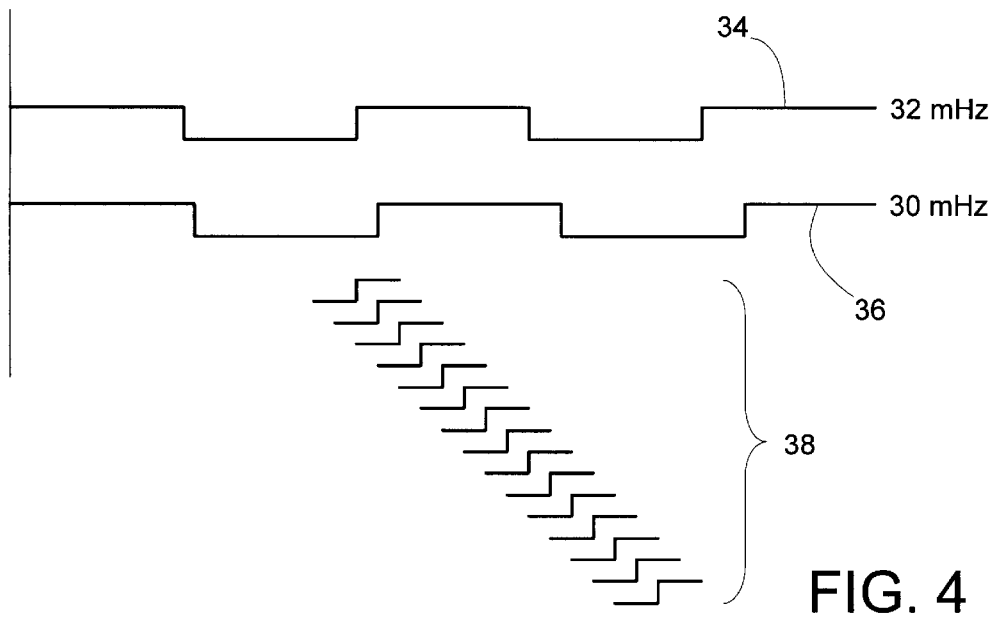
FIG. 4 is a time domain diagram of the phase relationship between a first clock signal and a second clock signal in accordance with one embodiment of this invention.

Referring to FIG. 4, a time domain diagram of a first clock 34 at a first frequency and a second clock 36 at a second frequency less than the first frequency is shown. It should be appreciated that for any two clock frequencies 34 and 36, there are a discrete quantity of phases 38 by which the two clock frequencies 34 and 36 may differ. That discrete quantity of phases 38 is equal to the numerator of the fraction (after all common factors are cancelled):

$$\text{Quantity of Phases} = \frac{\text{First Clock Frequency}}{\text{Second Clock Frequency}}$$

As previously discussed, in the preferred embodiment the first clock frequency 34 is 32 MHz while the second clock frequency 36 is 30 Mhz and as such, the quantity of discrete phases 38 is (15). Because there are (15) discrete phases, there are (15) discrete values for the value $\Delta t/T$ and there are (15) discrete values for the value $(1-\Delta t/T)$. The (15) discrete values of $\Delta t/T$ are:

| | |
|---|---|
| 1- | 0.066667 |
| 2- | 0.133333 |
| 3- | 0.200000 |
| 4- | 0.266667 |
| 5- | 0.333333 |
| 6- | 0.400000 |
| 7- | 0.466667 |
| 8- | 0.533333 |
| 9- | 0.600000 |
| 10- | 0.666667 |
| 11- | 0.733333 |
| 12- | 0.800000 |
| 13- | 0.866666 |
| 14- | 0.933333 |
| 15- | 1.000000 |

It should be noted that phase (15) may be considered the "in phase" phase because the offset between pulses of the first clock frequency and the second clock frequency is zero.

Figure 5:
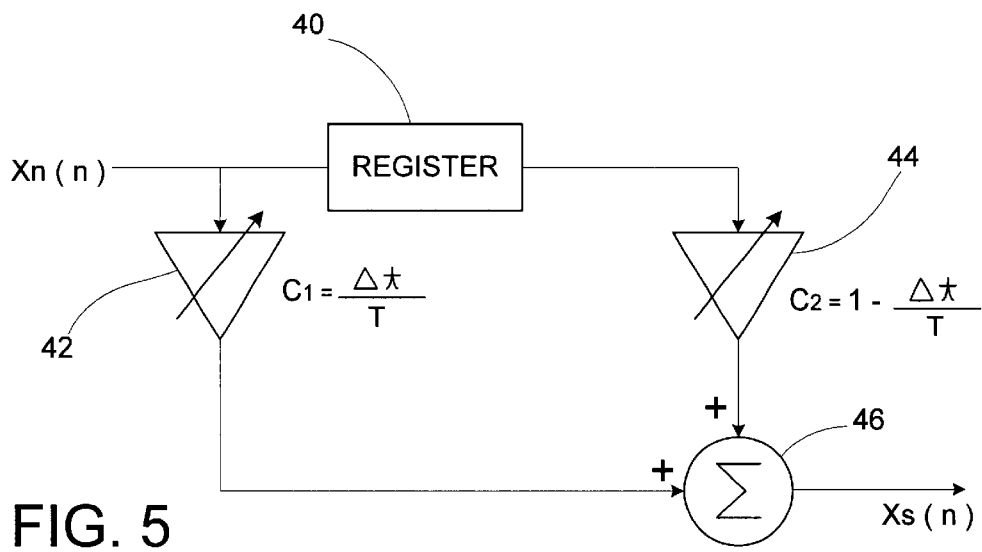
FIG. 5 is a block diagram showing a device for performing linear interpolation in accordance with one embodiment of this invention.

Referring to FIG. 5, a block diagram of a circuit for performing linear interpolation is shown. An input value $X_n$ is input to both a first adjustable amplifier, which in a digital implementation is simply a multiplier, 42 and a register 40. Register 40 operates to delay input values by one cycle so that the output of register 40 is $X_{n-1}$ which is input into a second adjustable amplifier 44 simultaneously with the value $X_n$ being input to the first adjustable amplifier 42. First adjustable amplifier 42 operates to amplify, or multiply, the value $X_n$ by the appropriate one of the (15) possible values of $\Delta t/T$ while the second adjustable amplifier operates to amplify, or multiply, the value $X_{n-1}$ by the appropriate one of the (15) possible values of $(1-\Delta t/T)$. The output of the first adjustable amplifier 42 and the second adjustable amplifier 44 are input to a summer 46 which in accordance with the previously described formula, generates the output value $X_s$.

Referring back to FIG. 2, it should be appreciated that the value 30 (*f*)' calculated by linear interpolation between values 28 (*f*) and 28 (*g*) is not the exact value 30 (*f*) that would have been generated had the A/D converter actually measured the signal at the time corresponding to the value 30 (*f*). The following error analysis will demonstrate that the above described device and method will not yield significant error. It should be appreciated that the maximum error will occur at the point of maximum curvature of the pulse, that being $\pi/2$, and the frequency at such point is 0.6 Mhz. At 32 Mhz, the period of each sample is 31.25 nsec. As such, the maximum error is:

Max Error=Amplitude (1−sin(2πx0.6 Mhz(1/(4x0.6 Mhz)+15.625 nsec))).

Therefore, at an amplitude on the order of 1.65V the maximum error is on the order of 2.86 mV. It should be appreciated that by using a 7-bit A/D converter in such an environment, the voltage increment represented by each bit increment is equal to the amplitude divided by $2^7$, or 128. Therefore, the voltage increment represented by each bit increment is 12.89 mV. The maximum error is on the order of only 20% of the voltage increment between bit increments of the A/D converter.

It should be appreciated that the above described device and methods provide for converting a series of sample values that digitally represent a signal at a first sampling rate to a series of sample values digitally representing the signal at a second sampling rate. Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A demodulation circuit comprising:

a) a demodulation circuit receiving a first series of sample values representing a modulated carrier and generating a first series of sample data values representing a first channel base band data signal, the first series of sample values occurring at a first sampling rate; and b) a resampler receiving the first series of sample data values and generating a second series of sample values representing the first channel base band data signal, the second series of sample values occurring at a predetermined second sampling rate, the second sampling rate being a lower frequency than the first sampling rate, wherein each sample value in the second series of sample values is at one of a plurality of predetermined discrete phases of offset from the first series of sample values and is generated by performing a linear interpolation between the sample value in the first series of sample values preceding the sample value and the sample value in the first series of sample values following the sample value utilizing a predetermined coefficient associated with the sample values discrete phase of offset to perform the interpolation.

2. The demodulation circuit of claim 1, further including a second demodulation circuit receiving the series of sample values representing a modulated carrier and generating a series of second channel base band sample values representing a second channel base band data signal, the second channel base band sample values occurring at the first sampling rate.

3. The demodulation circuit of claim 2, wherein the linear interpolation is performed in a circuit utilizing a first multiplier multiplying the sample value in the first series of sample values following the out of phase value by a first coefficient and a second multiplier multiplying the sample value in the first series of sample values preceding the out of phase value by a second coefficient, the second coefficient being equal to one minus the first coefficient, and an adder adding a product of the first multiplier to a product of the second multiplier to generate the out of phase value.

4. The demodulation circuit of claim 3, wherein the modulated carrier is at least one of a pulse position modulated carrier and a quadrature amplitude modulated carrier.

5. The demodulation circuit of claim 4, wherein the first sampling rate is 32 Mhz, the second sampling rate is 30 Mhz, and a ratio of in phase values to out of phase values is 1:15.

6. A method of recovering data from a modulated carrier, comprising:
   a) sampling the modulated carrier with an A/D converter to generate a first series of modulated carrier sample values representing the modulated carrier, the modulated carrier sample values occurring at a first sampling frequency;
   b) demodulating the series of modulated carrier sample values to generate a first series of sample values representing a first channel base band data signal, the first series of sample values occurring at the first sampling frequency; and
   c) generating a second series of sample values representing the first channel base band data signal, the second series of sample values occurring at a predetermined second sampling frequency, the second sampling frequency having a lower frequency than the first sampling frequency, wherein each sample value in the second series of sample values is at one of a plurality of predetermined discrete phases of offset from the first series of sample values and is generated by performing a linear interpolation between the sample value in the first series of sample values preceding the sample value and the sample value in the first series of sample values following the sample value utilizing a predetermined coefficient associated with the sample values discrete phase of offset to perform the interpolation.

7. The method of recovering data from a demodulated carrier of claim 6, further including demodulating the series of modulated carrier sample values to generate a third series of sample values representing a second channel base band data signal.

8. The method of recovering data from a modulated carrier of claim 7, wherein the linear interpolation is performed in a circuit utilizing a first multiplier multiplying the sample value in the first series of sample values following the out of phase value by a first coefficient and a second multiplier multiplying the sample value in the first series of sample values preceding the out of phase value by a second coefficient, the second coefficient being equal to one minus the first coefficient, and an adder adding a product of the first multiplier to a product of the second multiplier to generate the out of phase value.

9. The method of recovering data from a modulated carrier of claim 8, wherein the modulated carrier is at lease one of a pulse position modulated carrier and a quadrature amplitude modulated carrier.

10. The method of recovering data from a modulated carrier of claim 9, wherein the first sampling rate is 32 Mhz, the second sampling rate is 30 Mhz, and a ratio of in phase values to out of phase values is 1:15.

* * * * *

UNITED STATES PATENT AND TRADEMARK OFFICE
CERTIFICATE OF CORRECTION

PATENT NO. : 6,252,453 B1
DATED : June 26, 2001
INVENTOR(S) : Colin D. Nayler

It is certified that error appears in the above-identified patent and that said Letters Patent is hereby corrected as shown below:

<u>Column 2,</u>
Line 21, replace "two AID converts" with -- two A/D converts --.

<u>Column 4,</u>
Line 13, replace "The AND converter 14" with -- The A/D converter 14 --.

Signed and Sealed this

Twenty-sixth Day of February, 2002

Attest:

JAMES E. ROGAN
Attesting Officer
Director of the United States Patent and Trademark Office